(12) United States Patent
Nickel et al.

(10) Patent No.: US 8,742,997 B2
(45) Date of Patent: Jun. 3, 2014

(54) TESTING SYSTEM WITH ELECTRICALLY COUPLED AND WIRELESSLY COUPLED PROBES

(75) Inventors: Joshua G. Nickel, San Jose, CA (US);
James L. McPeak, Fremont, CA (US);
Jr-Yi Shen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 349 days.

(21) Appl. No.: 13/111,926

(22) Filed: May 19, 2011

(65) Prior Publication Data

US 2012/0293379 A1  Nov. 22, 2012

(51) Int. Cl.
*G01R 29/10* (2006.01)

(52) U.S. Cl.
USPC ..................... 343/703; 343/700 R

(58) Field of Classification Search
USPC ............... 343/703; 324/76; 455/67
See application file for complete search history.

(56) References Cited

U.S. PATENT DOCUMENTS

| | | | |
|---|---|---|---|
| 5,552,791 A * | 9/1996 | Metal | 342/174 |
| 5,631,572 A | 5/1997 | Sheen et al. | |
| 6,236,220 B1 | 5/2001 | Enguent | |
| 7,081,869 B2 | 7/2006 | Sommerfeld et al. | |
| 7,249,302 B2 | 7/2007 | Maltseff et al. | |
| 2003/0016039 A1 | 1/2003 | Williams et al. | |
| 2004/0140821 A1 | 7/2004 | Lee | |
| 2006/0197538 A1 | 9/2006 | Leinonen et al. | |
| 2009/0281381 A1 | 11/2009 | Takenaka et al. | |
| 2010/0060529 A1 | 3/2010 | Schlub et al. | |
| 2012/0176906 A1* | 7/2012 | Hartenstein et al. | 370/241 |

FOREIGN PATENT DOCUMENTS

| | | |
|---|---|---|
| JP | 2006171978 | 6/2006 |
| WO | 9520766 | 8/1995 |

OTHER PUBLICATIONS

Nickel et al., U.S. Appl. No. 13/183,393, filed Jul. 14, 2011.
Daliri et al., "Circular Microstrip Patch Antenna Strain Sensor for Wireless Structural Health Monitoring" Proceedings of the World Congress on Engineering 2010 vol. II, WCE 2010, Jun. 30-Jul. 2, 2010, London, U.K.
Blabac, "Surface penetrating radar for condition assessment of concrete masonry structures", [retrieved on Apr. 22, 2011]. Retrieved from the Internet: http://www.gostructural.com/print-magazinearticle-seeing_is_believing-4167.html.

(Continued)

*Primary Examiner* — Michael G. Lee
*Assistant Examiner* — Matthew Mikels
(74) *Attorney, Agent, or Firm* — Treyz Law Group; Jason Tsai; Michael H. Lyons

(57) ABSTRACT

Conductive electronic device structures such as a conductive housing member that forms part of an antenna may be tested during manufacturing. A test system may be provided that has a pair of pins or other contacts. Test equipment such as a network analyzer may provide radio-frequency test signals in a range of frequencies. The radio-frequency test signals may be applied to the conductive housing member or other conductive structures under test using the test probe contacts. An antenna may be used to gather corresponding wireless radio-frequency signal data. Forward transfer coefficient data may be computed from the transmitted and received radio-frequency signals. The forward transfer coefficient data or other test data may be compared to reference data to determine whether the conductive electronic device structures contain a fault.

11 Claims, 10 Drawing Sheets

(56) References Cited

OTHER PUBLICATIONS

Ghodgaonkar et al., "Microwave Nondestructive Testing of Composite Materials using Free-Space Microwave Measurement Techniques", [retrieved on Apr. 22, 2011]. Retrieved from the Internet: http://www.ndt.net/article/wcndt00/papers/idn251/idn251.htm.

Zoughi et al., "Microwave and millimetre wave sensors for crack detection", (abstract) Aug. 2008 [retrieved on Apr. 22, 2011]. Retrieved from the Internet: http://scholarsmine.mst.edu/post_printsMicrowaveAndMillimetreWaveSensorsForCrackDe_09007dcc805a931d.html.

Abou-Khousa et al., "Novel and simple high-frequency single-port vector network analyzer" (abstract) Mar. 2010 [retrieved on Apr. 22, 2011].Retrieved from the Internet: http://scholarsmine.mst.edu/post_prints/NovelAndSimpleHighFrequencySinglePortVect_09007dcc808993ba.html.

Nickel et al. U.S. Appl. No. 12/869,617, filed Aug. 26, 2010.
Nickel et al. U.S. Appl. No. 13/097,847, filed Apr. 29, 2011.
Nickel et al. U.S. Appl. No. 13/092,808, filed Apr. 22, 2011.

* cited by examiner

TESTING SYSTEM WITH ELECTRICALLY COUPLED AND WIRELESSLY COUPLED PROBES

BACKGROUND

This relates generally to testing, and more particularly, to testing electronic device structures for manufacturing faults.

Electronic devices such as portable computers and cellular telephones are often provided with wireless communications capabilities. For example, electronic devices may use long-range wireless communications circuitry such as cellular telephone circuitry and short-range wireless communications circuitry such as wireless local area network circuitry.

In some devices, conductive housing structures may form part of an electronic device antenna. The performance of this type of antenna may depend on how accurately the conductive housing structures are manufactured. Excessive variations in the size and shape of conductive electronic device housing structures or other manufacturing variations may have a negative impact on the performance of antennas formed using the structures. Variations in conductive electronic device structures of other types may also impact device performance.

It would be desirable to be able to provide ways to test electronic device structures such as conductive electronic device structures that form parts of antennas and other structures.

SUMMARY

Electronic devices may include conductive structures such as conductive housing structures. Conductive electronic device housing structures may form part of an antenna or other structures.

To ensure that conductive electronic device structures have been fabricated properly, conductive electronic device structures may be tested during manufacturing. A test system may be provided that has a test probe with pins or other contacts and an antenna that serves as a wireless test probe.

Test equipment such as a network analyzer may provide radio-frequency test signals in a range of frequencies. The radio-frequency test signals may be applied to the conductive housing member or other conductive structures under test using the test probe contacts. The antenna may be used to gather corresponding wireless radio-frequency data.

Forward transfer coefficient data may be computed from the transmitted and received radio-frequency signals. The forward transfer coefficient data or other test data may be compared to reference data to determine whether the conductive electronic device structures contain a fault.

Further features of the invention, its nature and various advantages will be more apparent from the accompanying drawings and the following detailed description of the preferred embodiments.

DETAILED DESCRIPTION

Electronic devices may be provided with wireless communications circuitry such as antennas and associated transceiver circuits. The wireless communications circuitry may be used to support wireless communications in multiple wireless communications bands. The wireless communications circuitry may include one or more antennas.

The antennas can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures. The conductive electronic device structures may include conductive housing structures. The housing structures may include a peripheral conductive member that runs around the periphery of an electronic device. The peripheral conductive member may serve as a bezel for a planar structure such as a display, may serve as sidewall structures for a device housing, or may form other housing structures. Gaps in the peripheral conductive member may be associated with the antennas.

The size of the gaps and the presence or absence of manufacturing artifacts such as metal burrs or other unintended conductive structures in the gaps that are produced during manufacturing can influence the electrical properties of the antennas that are formed using the peripheral conductive housing members. To ensure that the gaps are formed appropriately, it may be desirable to electrically test the peripheral conductive housing member during manufacturing. The electrical test measurements may reveal undesired manufacturing variations in the gaps. Other conductive electronic device structures may also be tested in this way if desired.

A typical test setup used to detect such types of manufacturing defects involves passive antenna testing. During passive antenna testing, the antenna is energized using an input signal, the reflection of which is measured to obtain a reflection coefficient (S11). Simply monitoring S11 may not sufficiently characterize the antenna because no radiated signal from the antenna is measured. There are some defects which cause a drop in antenna efficiency without a corresponding or measurable change to the antenna input impedance. In these cases, only a radiated test is capable of detecting such variations. Such a measurement requires a second port connected to the test antenna that samples signals radiated from the antenna structures under test.

Figure 1:
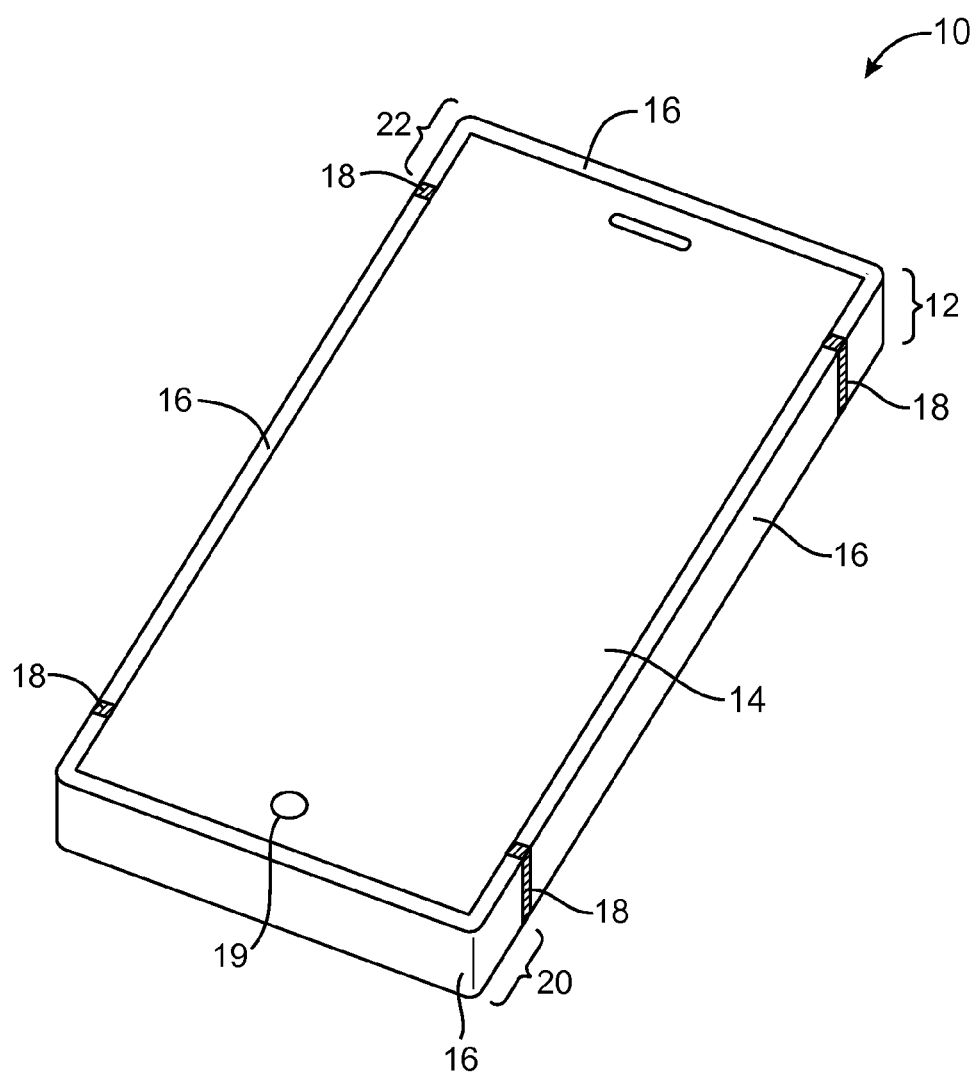
FIG. 1 is a perspective view of an illustrative electronic device of the type that may include conductive housing structures that may be tested in accordance with an embodiment of the present invention.

An illustrative electronic device of the type that may be provided with conductive electronic device structures such as a peripheral conductive housing member that forms part of one or more antennas is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed from light-emitting diodes (LEDs), organic LEDs (OLEDs), plasma cells, electronic ink elements, liquid crystal display (LCD) components, or other suitable image pixel structures. A cover glass layer may cover the surface of display 14. Buttons such as button 19 may pass through openings in the cover glass.

Housing 12 may include structures such as housing member 16. Member 16 may run around the rectangular periphery of device 10 and display 14. Member 16 or part of member 16 may serve as a bezel for display 14 (e.g., a cosmetic trim that surrounds all four sides of display 14 and/or helps hold display 14 to device 10). Member 16 may also, if desired, form sidewall structures for device 10.

Member 16 may be formed of a conductive material and may therefore sometimes be referred to as a peripheral conductive housing member or conductive housing structures. Member 16 may be formed from a metal such as stainless steel, aluminum, or other suitable materials. One, two, or more than two separate structures may be used in forming member 16.

It is not necessary for member 16 to have a uniform cross-section. For example, the top portion of member 16 may, if desired, have an inwardly protruding lip that helps hold display 14 in place. If desired, the bottom portion of member 16 may also have an enlarged lip (e.g., in the plane of the rear surface of device 10). In the example of FIG. 1, member 16 has substantially straight vertical sidewalls. This is merely illustrative. The sidewalls of member 16 may be curved or may have any other suitable shape. In some configurations (e.g., when member 16 serves as a bezel for display 14), member 16 may run around the lip of housing 12 (i.e., member 16 may cover only the edge of housing 12 that surrounds display 14 and not the rear edge of the sidewalls of housing 12).

Display 14 may include conductive structures such as an array of capacitive electrodes, conductive lines for addressing pixel elements, driver circuits, etc. Housing 12 may include internal structures such as metal frame members, a planar housing member (sometimes referred to as a midplate) that spans the walls of housing 12 (i.e., a sheet metal structure that is welded or otherwise connected between the opposing right and left sides of member 16), printed circuit boards, and other internal conductive structures. These conductive structures may be located in center of housing 12 (as an example).

In regions 20 and 22, openings may be formed between the conductive housing structures and conductive electrical components that make up device 10. These openings may be filled with air, plastic, and other dielectrics. Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, or may otherwise serve as part of antenna structures formed in regions 20 and 22.

Portions of member 16 may be provided with gap structures 18. Gaps 18 may be filled with dielectric such as polymer, ceramic, glass, etc. Gaps 18 may divide member 16 into one or more peripheral conductive member segments. There may be, for example, two segments of member 16 (e.g., in an arrangement with two gaps), three segments of member 16 (e.g., in an arrangement with three gaps), four segments of member 16 (e.g., in an arrangement with four gaps, etc.). The segments of peripheral conductive member 16 that are formed in this way may form parts of antennas in device 10.

Figure 2:
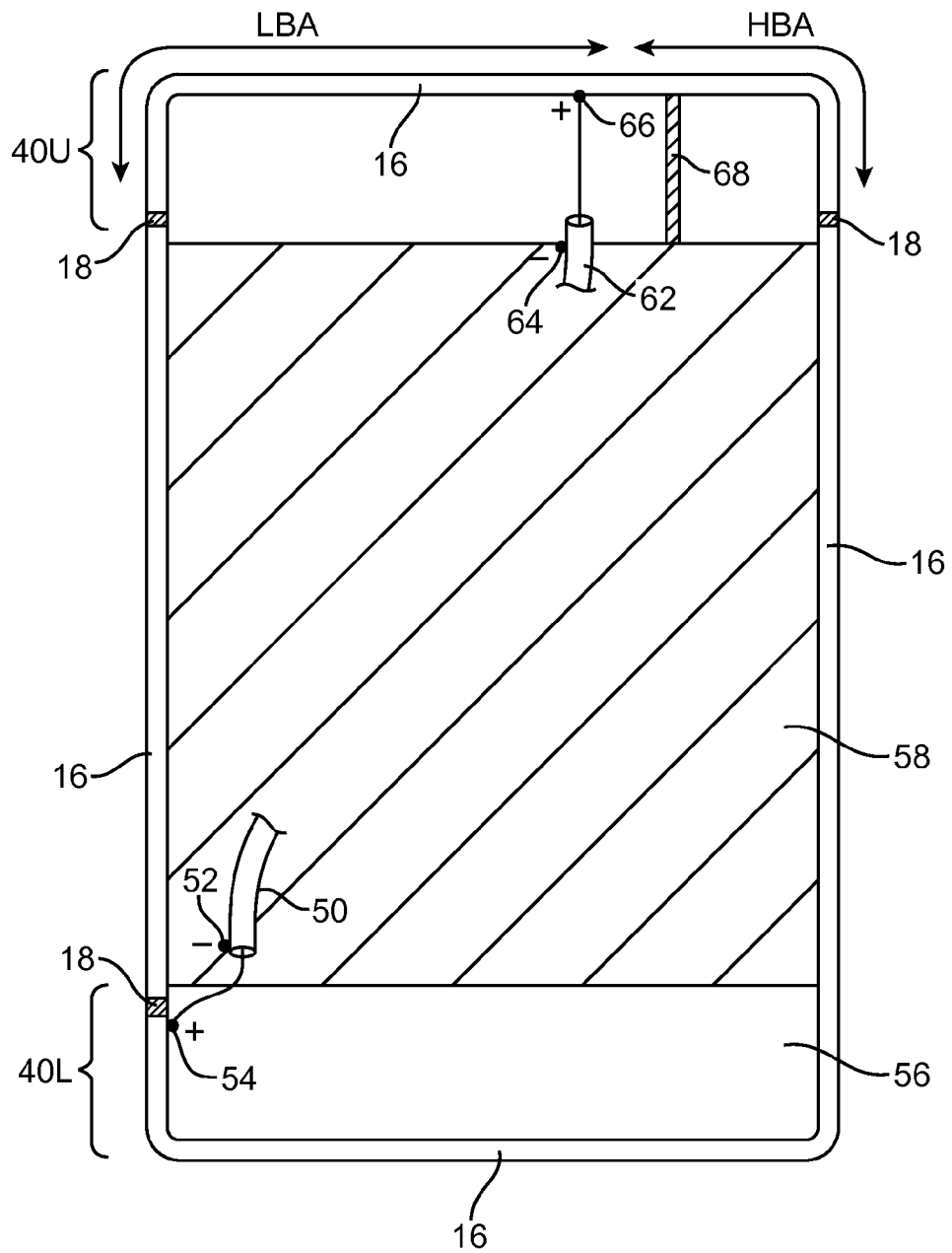
FIG. 2 is a top view of an illustrative electronic device of the type shown in FIG. 1 showing the locations of gaps in a peripheral conductive housing member and the locations of possible antennas within the electronic device in accordance with an embodiment of the present invention.

A top view of an interior portion of device 10 is shown in FIG. 2. If desired, device 10 may have upper and lower antennas (as an example). An upper antenna such as antenna 40U may, for example, be formed at the upper end of device 10 in region 22. A lower antenna such as antenna 40L may, for example, be formed at the lower end of device 10 in region 20. The antennas may be used separately to cover separate communications bands of interest or may be used together to implement an antenna diversity scheme or a multiple-input-multiple-output (MIMO) antenna scheme.

Antenna 40L may be formed from the portions of midplate 58 and peripheral conductive housing member 16 that surround dielectric-filled opening 56. Antenna 40L may be fed by transmission line 50, which is coupled to positive feed terminal 54 and ground feed terminal 52. Other feed arrangements may be used if desired. The arrangement of FIG. 2 is merely illustrative.

Antenna 40U may be formed from the portions of midplate 58 and peripheral conductive housing member 16 that surround dielectric-filled opening 60. Member 16 may have a low-band segment LBA that terminates at one of gaps 18 and a high-band segment HBA that terminates at another one of gaps 18. Antenna 40U may be fed using transmission line 62. Transmission line 62 may be coupled to positive antenna feed terminal 66 and ground antenna feed terminal 64 (as an example). Conductive member 68 may span opening 60 to form an inverted-F antenna short-circuit path. Segments LBA and HBA may form low-band and high-band cellular telephone inverted-F antennas (as an example).

Gaps 18 separate respective portions of peripheral conductive housing member 16. Due to manufacturing variations, the structures associated with gaps 18 may not always be perfect. For example, during machining operations, small conductive filaments (metal burrs) may be produced within gap 18. These burrs may adversely affect antenna operation (e.g., by giving rise to inductances or other parasitic electrical characteristics that detune the antenna and/or reduce antenna efficiency at desired frequencies of operation).

The metal burrs in gaps 18 may be too small to reliably detect using visual inspection. As a result, the metal burrs may not be noticed before gaps 18 are filled with plastic. After gaps 18 have been filled with a dielectric such as plastic, it may be impossible to visually detect the presence of the burrs.

Conventionally, wireless over-the-air communications testing on completed devices such as device 10 may reveal the presence of wireless performance problems, but may not reveal whether or not these problems are due to burrs or other manufacturing defects and may not detect these problems at a sufficiently early stage in the manufacturing process.

Figure 3:
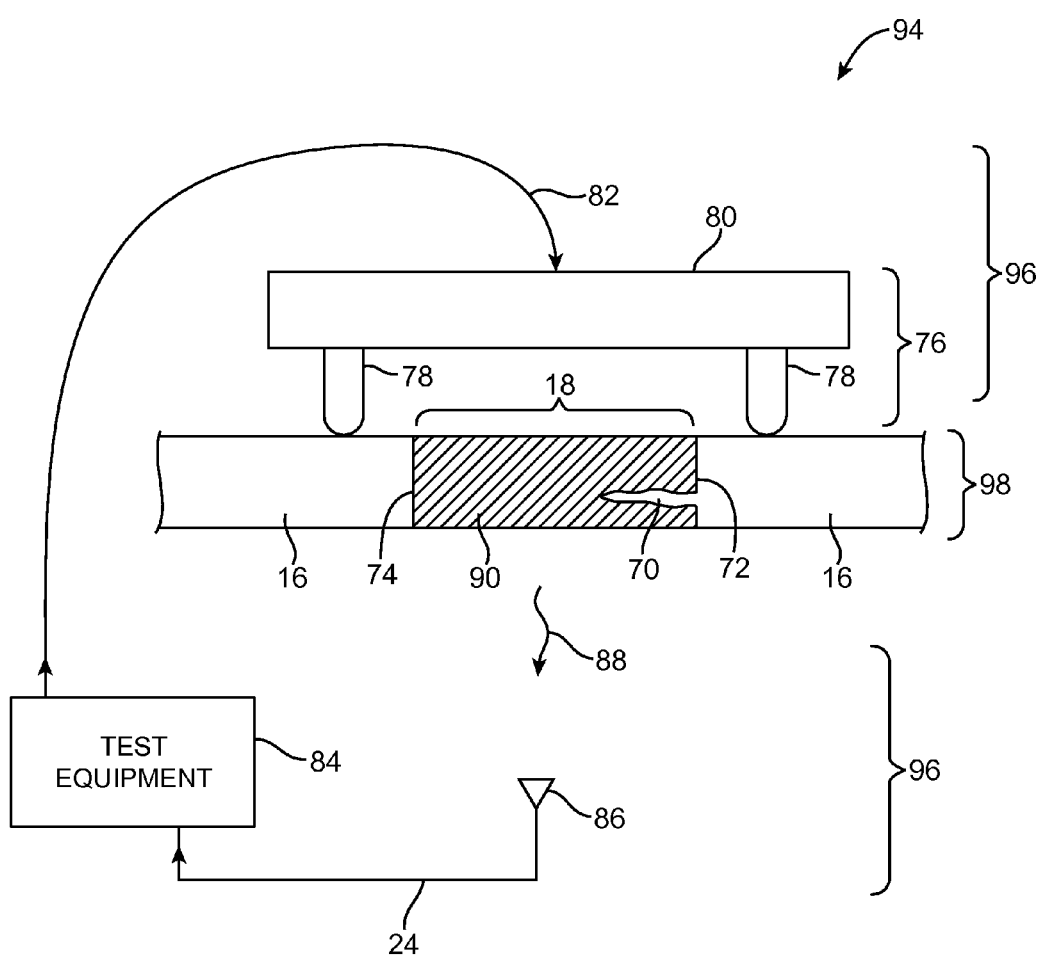
FIG. 3 is a side view of a test system showing how an electronic device structure such as a peripheral conductive housing member with a gap may be tested using an electrically connected probe and an antenna in accordance with an embodiment of the present invention.

A test system of the type that may be used in testing electronic device structures such as peripheral conductive housing member 16 at a potentially earlier stage in the assembly process is shown in FIG. 3. As shown in FIG. 3, test system 94 may include test equipment 96 for testing device structures under test 98. Device structures under test 98 may include conductive electronic device housing structures such as peripheral conductive housing member 16 and other conductive electronic device structures. As described in connection with FIGS. 1 and 2, the conductive electronic device structures may form part of one or more antennas in device 10.

Test equipment 96 may include wired test probe 76 and wireless probe 86. Probe 76 may have a body such as probe structure 80 and associated electrical contacts 78. Probe structure 80 may have a radio-frequency connector or other interface with which probe structure 80 can be coupled to radio-frequency transmission line path 82. Path 82 may be implemented using a coaxial cable or other transmission line structure and may be coupled to test equipment 84. Contacts 78 may be spring-loaded pins, metal pads on a flexible printed circuit ("flex circuit") substrate or other dielectric substrate, springs, or other conductive contact structures. For example, test probe 76 may be a pogo-pin test probe that includes first and second electrical contacts 78 operable to make contact with feed terminal points 64 and 66, respectively, or other regions of the antenna structures under test (e.g., other points along conductive member 16, midplate 58, conductive path 68, etc.).

Wireless probe 86 may be formed from one or more antennas, so probe 86 may sometimes be referred to herein as a test system antenna. Antenna 86 may be coupled to test equipment 84 by radio-frequency path 24. Path 24 may be formed from a coaxial cable or other transmission line structure. Antenna test probe 86 may be implemented using any suitable antenna type (e.g., loop antennas, patch antennas, dipole antennas, monopole antennas, inverted-F antennas, planar inverted-F antennas, coil antennas, open-ended waveguides, horn antennas, etc.).

Test equipment 84 may include a network analyzer (e.g., a vector network analyzer) and one or more computers or other computing equipment. The network analyzer or other test equipment may be used to generate test signals over a desired range of frequencies. For example, the network analyzer may be used to generate test signals in a frequency range of 0 to 5 GHz (as an example). Other frequency ranges may be used in testing device structures under test 98 if desired (e.g., a frequency range of 4 to 5 GHz, a frequency range of 3 to 5 GHz, a frequency range with a size of more or less than 5 GHz starting at a frequency below or above 5 GHz), etc.

The test signals that are generated by test equipment 84 may be applied to device structures under test 98 using test probe 76. In particular, radio-frequency test signals from test equipment 84 may be conveyed to probe 76 via path 82. Path 82 may include a positive conductor that is coupled to a first of contacts 78 and a ground conductor that is coupled to a second of contacts 78. In the illustrative arrangement of FIG. 3, the left-hand probe contact is contacting to the left-hand segment of peripheral conductive housing member 16 and the right-hand probe contact is contacting the right-hand segment of peripheral conductive housing member 16. In other configurations, contacts 78 may be coupled to other portions of a conductive electronic device structure. The configuration of FIG. 3 is merely illustrative.

As shown in FIG. 3, gap 18 may be filled with a dielectric such as dielectric 90. Dielectric 90 may be a polymer, glass, ceramic, or other suitable dielectric materials. Structures such as conductive filament 70 (e.g., a metal burr) may sometimes be formed within gap 18 as an side effect of a machining process or other manufacturing process (molding, stamping, welding, etc.) that is used in forming and shaping peripheral conductive housing member 16 and gap 18. The presence of manufacturing faults such as burr 70 may be detected by using a wireless probe such as antenna 86 to wirelessly monitor electromagnetic radio-frequency signals 88 that are emitted by device structures under test 98 while test equipment 84 is driving test signals from probe 76 into device structures under test 98. Antenna 86 can convey these measured electromagnetic signals to test equipment 84 (e.g., the network analyzer in equipment 84) via path 94 (e.g., a coaxial cable or other transmission line).

Figure 4:
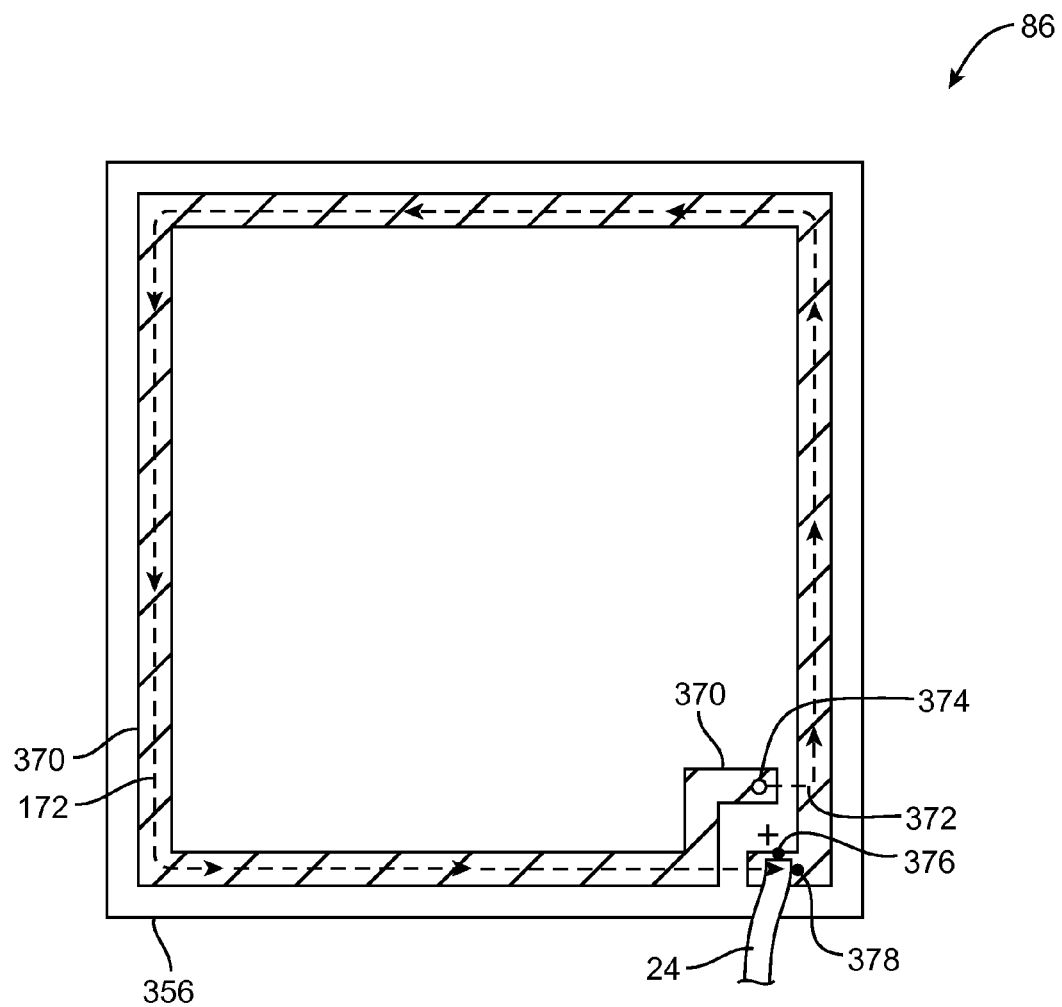
FIG. 4 is a diagram of an illustrative loop antenna that may be used in implementing the antenna of the test system of FIG. 3 in accordance with an embodiment of the present invention.

Antenna probe 86 may be formed from any suitable type of antenna (e.g., a loop antenna, an inverted-F antenna, a strip antenna, a planar inverted-F antenna, a slot antenna, a monopole, a dipole, a patch antenna, a hybrid antenna that includes antenna structures of more than one type, or other suitable antennas). FIG. 4 is a top view of an illustrative loop antenna that may be used to form antenna probe 86. As shown in FIG. 4, antenna 86 may include a substrate such as substrate 356. Substrate 356 may be formed from a dielectric such as plastic, may be formed from a rigid printed circuit board substrate such as fiberglass-filled epoxy, may be formed from a flexible printed circuit ("flex circuit") substrate such as a sheet of polyimide, or may be formed from other dielectric substrate materials. Conductive traces such as conductive metal traces may be used to form antenna structures on substrate 356.

In the example of FIG. 4, conductive traces 370 on substrate 356 have been used to form a loop antenna. Coaxial cable 24 (or other transmission line) may have a positive conductor coupled to positive antenna feed terminal 376 and a ground conductor coupled to ground antenna feed terminal 378. Positive antenna feed terminal 376 is coupled to upper conductive trace 370. Via 374 couples upper trace 370 to lower trace 372 (e.g., a trace on an opposing surface of a printed circuit board substrate or in a different layer of substrate 356). After looping around the periphery of substrate 356 lower trace 372 may be connected to ground feed terminal 378 by a via structure. The illustrative loop antenna of FIG. 4 uses two loops (upper and lower), but additional loops (e.g., three or more loops) or fewer loops (e.g., a single loop) may be used in wireless probe 86 if desired.

Figure 5:
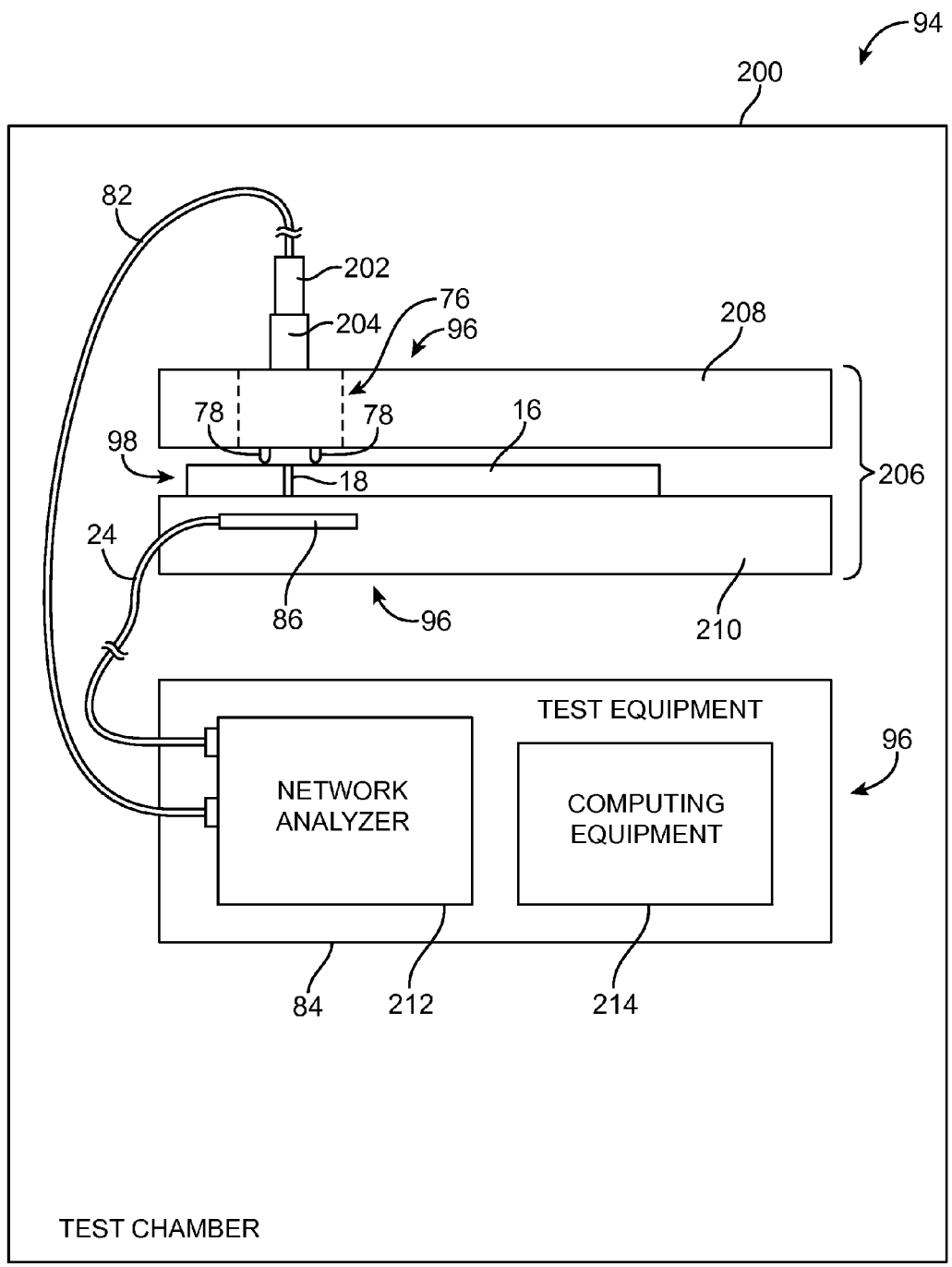
FIG. 5 is a diagram of an illustrative test system having a test chamber in which electronic device structures under test may be tested using electrically coupled and wirelessly coupled probes in accordance with an embodiment of the present invention.

As shown in FIG. 5, test equipment 96 and device structures under test 98 may be mounted in an optional test chamber. Test chamber 200 may have radio-opaque walls (e.g., metal walls) to reduce electromagnetic interference.

Device structures under test 98 may, if desired, be mounted in a test fixture such as test fixture 206. Test fixture 206 may be formed from a dielectric such as plastic and may include a lower test fixture portion such as base 210 and an upper test fixture portion such as cover 208. Contact probe 76 and its contacts 78 may be mounted in an opening in upper fixture 208 (as an example). When device structures under test are mounted in fixture 206, conductive portions of the device structures such as segments of peripheral conductive member 16 on opposing sides of gap 18 may be contacted by respective contacts 78. Connectors such as mating connectors 204 and 202 may be used in coupling cable 82 to probe 76. Antenna 86 may be mounted on or near to lower fixture portion 210. Cables 82 and 24 may be respectively used to couple probes 76 and 86 to network analyzer 212. Test equipment 84 may include one or more computers or other computing equipment 214 coupled to network analyzer 212 for gathering and processing data from network analyzer 212. Computing equipment 214 may, if desired, include input-output devices such as keyboards, mice, and displays, for gathering input from an operator of the test system and for displaying alerts and other information to the operator. Network analyzer 212 may also include input-output components such as a display, keypad, keys, etc.

Using test system 94, test equipment 84 (e.g., network analyzer 212) may produce radio-frequency test signals that are applied to device structures under test 98 using cable 82, connectors 202 and 204, and probe 76. Even without being connected to other components to form a completed antenna assembly for device 10, device structures under test 98 may emit wireless radio-frequency signals when driven using the test signals from probe 76. Antenna 86 may be placed in the vicinity of device structures under test 98 (e.g., within 1 to 10 cm of device structures under test 98 or more than 10 cm or less than 10 cm away from device structures under test 98) or may be placed at a far-field location (e.g., meters away from device structures under test 98 or closer or farther). During operation, as test electromagnetic signals are transmitted by network analyzer 212 and applied to device structures under test 98 through probe 76, corresponding transmitted wireless electromagnetic test signals may be received through antenna 86. Network analyzer 212 may also receive reflected signals from cable (i.e., signals that were reflected from device structures under test 98 in response to the signals transmitted through probe 76).

The transmitted and reflected signals gathered using path 82 may be used to compute a reflection coefficient (sometimes referred to as an S11 parameter or S11 scattering parameter). The transmitted signal on path 82 and corresponding received signal on path 24 may be used to compute a forward transfer coefficient (sometimes referred to as an S21 parameter or S21 scattering parameter). The S11 and S21 data may include magnitude and phase components. During initial calibration operations, nominal (expected) values of S11 and/or S21 may be measured and stored in computing equipment 214, network analyzer 212, or other equipment in test equipment 84 to use as reference data. During testing, S11 data and/or S21 data gathered using test equipment 96 may be compared to the reference data. If the gathered data substantially matches the reference data, test equipment 96 may inform an operator that device structures under test 98 are satisfactory or may take other suitable action. If the gathered data deviates from the reference data by more than a predetermined amount, test equipment 96 may inform the operator that device structures under test 98 include a fault and should be reworked or scrapped or may take other suitable action.

Figure 6:
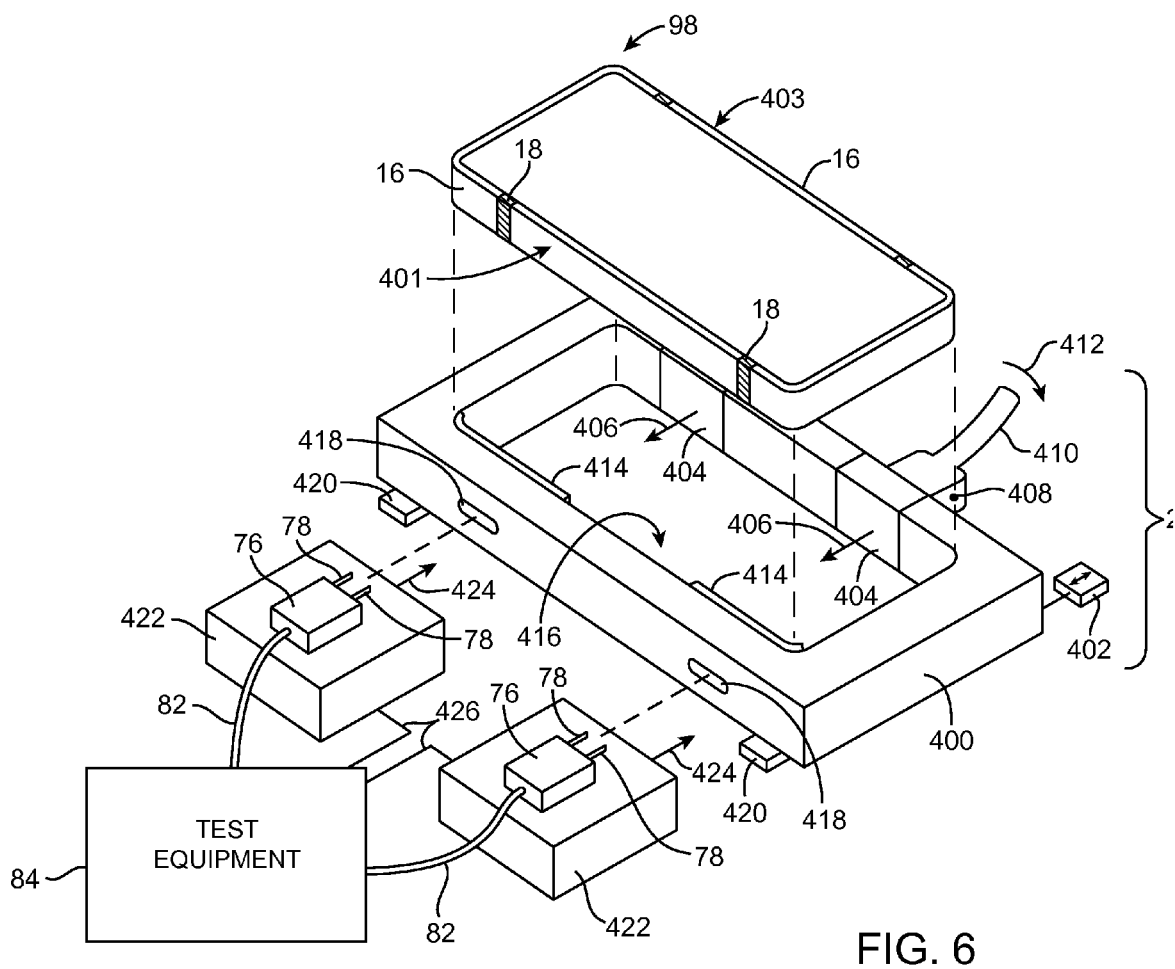
FIG. 6 is an exploded perspective view of illustrative electronic device structures under test in a test system in accordance with an embodiment of the present invention.

In some situations, peripheral conductive housing member 16 may be formed from a metal (e.g., stainless steel) that has a non-negligible contact resistance when probed by spring-loaded pins or other contact-based probes. The surface of member 16 may also be susceptible to scratching when probed using pins. It may therefore be desirable to use a capacitively coupled probe arrangement of the type shown in FIG. 6. FIG. 6 is a perspective view of an illustrative test system in which device structures under test 98 are being tested in test fixture 206. Device structures under test 98 may include structures used in forming an electronic device such as electronic device 10 of FIGS. 1 and 2. For example, device structures under test 98 may include conductive housing structures such as peripheral conductive housing member 16. Member 16 may have one or more dielectric-filled gaps 18. Testing of device structures under test 84 may reveal whether member 16 contains a fault.

Fixture 206 may have a fixture base such as base 400. Base 400 may be formed from a dielectric such as plastic (as an example). Base 400 may have a cavity such as cavity 416 that receives device structures under test 98 during testing.

When device structures under test 98 are placed within cavity 142, levers 410 may be moved downwards in direction 412 around pivot 408. This causes movable retention members 404 to move inwardly in direction 406 to serve as biasing structures that press against surface 403 of device structures under test 98. When surface 403 is pressed in direction 406, surface 98 is held firmly against probes 414 in cavity 416 of base 400, ensuring satisfactory capacitive coupling between capacitive coupling probes 414 and member 16 during testing. Probes 414 may, if desired, have screen-printed alignment marks between their respective electrodes to help align structures 98 and probes 414. If desired, a layer of compliant foam material may be interposed between probes 414 and base 400 to help secure device structures under test 98 firmly within cavity 416 during testing (e.g., to minimize possible gaps between structures 98 and probes 414 during testing).

Base 400 may have openings such as openings 418. Openings 418 may be configured to receive mating spring-loaded probes 76. For example, openings 418 may have an interior shape that matches the exterior shape of probes 76. The shapes of openings 418 and probes 76 may be asymmetric ("keyed") to ensure that probes 76 are inserted within openings 418 using a desired polarity. When moved in direction 424 by biasing structures 422, probes 76 may be received within openings 418 of fixture base 400, so that pins 78 mate with respective contact pads on probe 414 (i.e., pins 78 may make contact with capacitive coupling pads in probe 414).

For example, when probe 76 is mated with fixture 400, first and second probe pins may be electrically connected to respective first and second probe pads (sometimes referred to as first and second electrodes) in capacitive coupling probe 414. Probe terminals 78 may be placed in contact with the first and second probe pads using a robot or other computer-controlled positioner or manually. If desired, terminals 78 may be wires or other conductive paths associated with a cable and may be soldered directly to the probe pads without using a probe. The probe pads in probe 414 may be formed from metal traces in a flex circuit.

When placed against peripheral conductive housing member 16, the first probe pad and member 16 form a first parallel plate capacitor, whereas the second probe pad and peripheral conductive housing member 16 form a second parallel plate capacitor. Because pins are not used to directly probe member 16, member 16 will generally not be scratched during testing, which may be helpful when member 16 has a cosmetic surface that should not be damaged during testing.

Dielectric material in probe 414 may cover a portion of the first and second electrodes. When probe 414 is placed against conductive member 16 during testing, the dielectric material may serve to electrically isolate (insulate) the first and second electrodes from conductive member 16. Because electrical coupling is achieved without requiring direct metal-to-metal contact between the probe electrodes and member 16, satisfactory electrical coupling can be achieved at radio-frequencies even in the presence of an oxide or other coating that may give rise to a non-negligible contact resistance when probing the conductive structure with pins.

Biasing structures 422 may include a solenoid-based actuator, a pneumatic actuator, spring members to apply biasing force in direction 424, or other suitable biasing structures. These structures may be passive (e.g., fixed springs) or may be manually or automatically controlled. For example, biasing structures 422 may be coupled to test equipment 84 by control paths 426. Test equipment 84 may contain one or more computers or other computing equipment that issues commands to biasing structures 422 using paths 426. Fixture 400 may slide on rails such as rails 420. The position of fixture 400 may be adjusted manually or using a positioner such as computer-controlled positioner 402 that can be adjusted using computers in test equipment 84. Using positioner 402 and/or positioners 422, test structure 16 and probes 76 may be moved relative to each other to obtain optimal probe compression and placement.

The arrangement of FIG. 6 includes a pair of probes 76. These probes may be used individually or may be operated simultaneously. Additional capacitive coupling probes and other types of probes may be used in test fixture 206 if desired.

Figure 7:
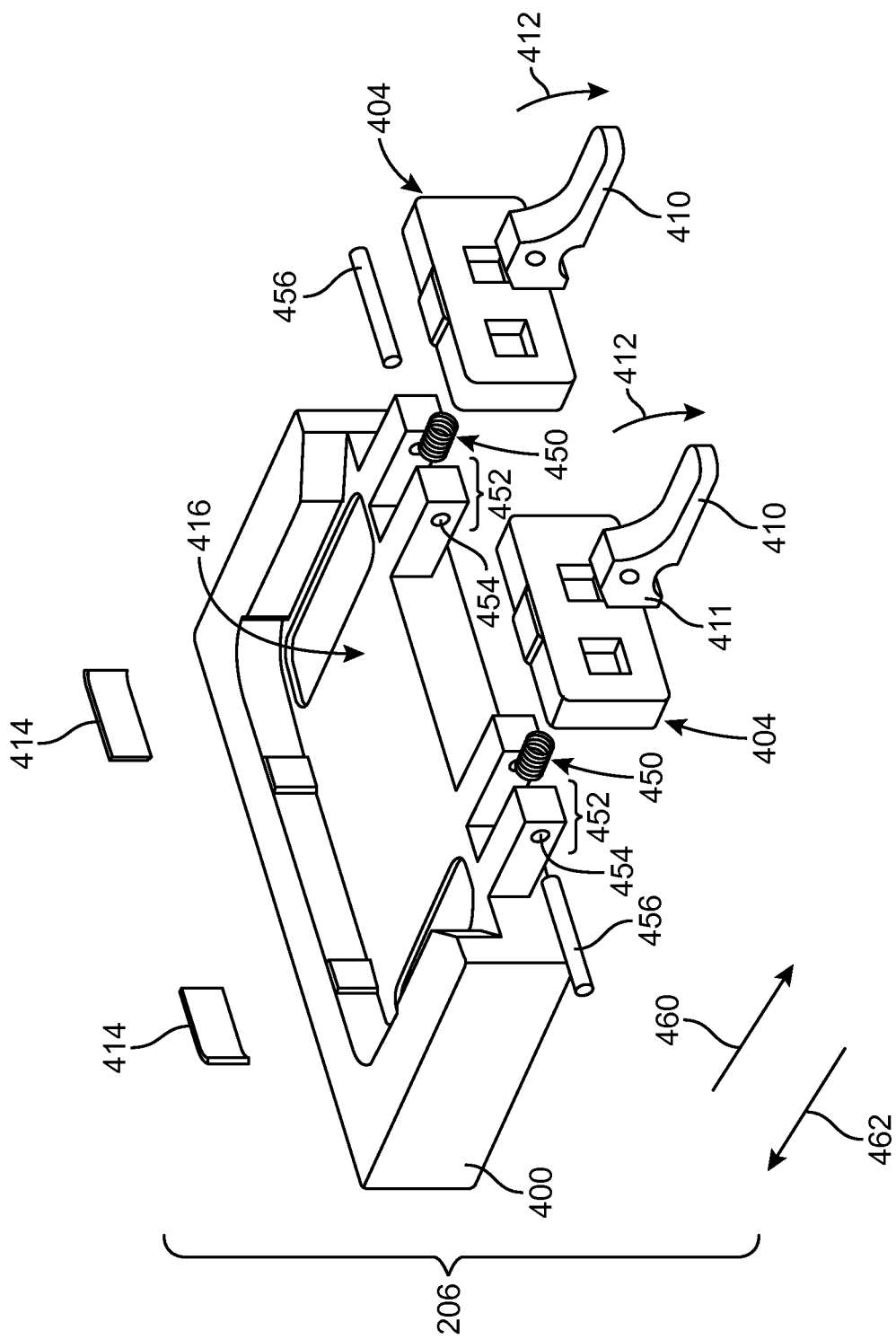
FIG. 7 is an exploded perspective view of an illustrative test fixture in accordance with an embodiment of the present invention.

An exploded perspective view of test fixture 206 is shown in FIG. 7. As shown in FIG. 7, base 400 may have a cavity such as a substantially rectangular cavity 416 for receiving device structures under test 98 (see, e.g., FIG. 6). Retention members 404 may have holes or other features that allow retention members 404 to slide along rails 452 in base 400. Springs 450 bias retention members 404 in direction 460. When assembled, pivot members 456 are placed in holes 454 of rails 452 (passing through holes 411 in levers 410). Springs 450 push retention member 404 in direction 460 and create space within cavity 416 for structures 98. When levers 410 are moved downward in direction 410, levers 410 push retention member 404 in direction 462 and hold device structures under test 98 firmly against capacitive coupling probes 414 within cavity 416.

Figure 8:
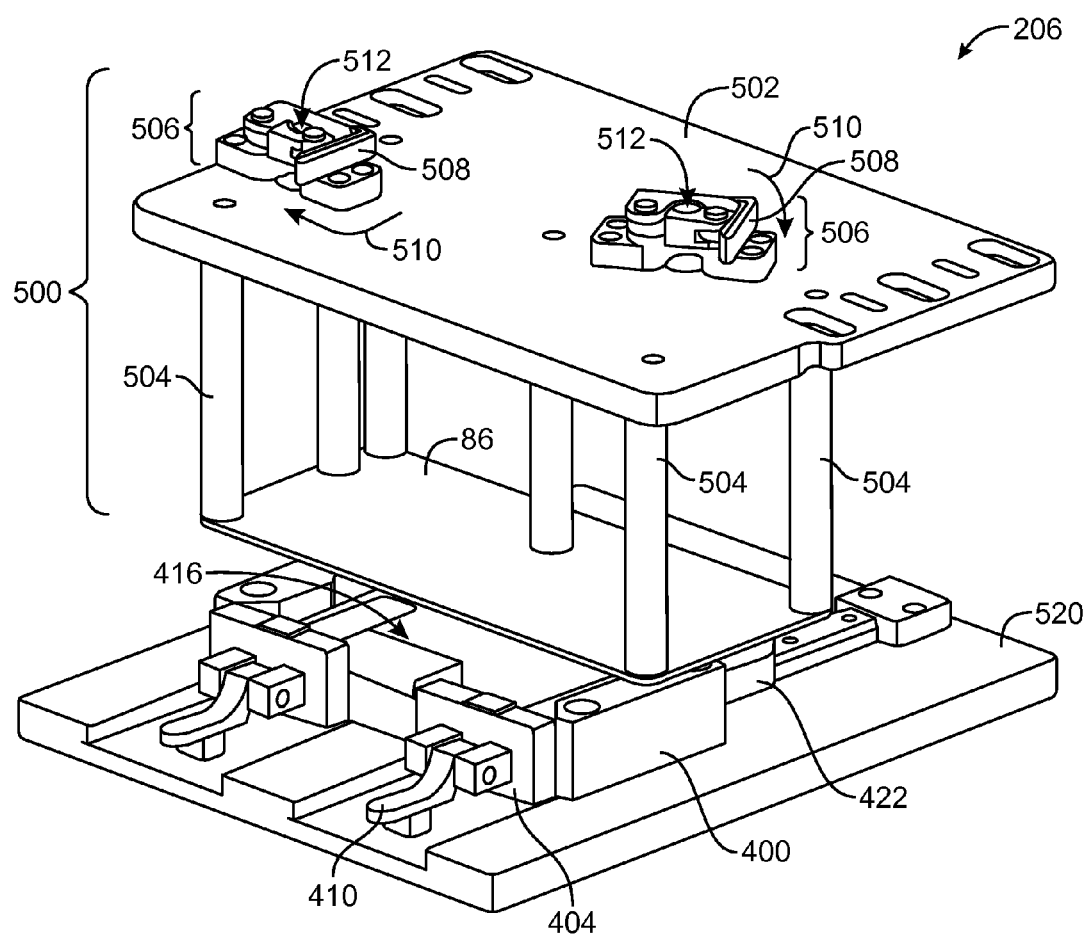
FIG. 8 is a perspective view of an illustrative test system having the test fixture of FIG. 7 and an antenna test fixture in accordance with an embodiment of the present invention.

FIG. 8 is a perspective view of test fixture 206 having a lower test fixture portion (e.g., the test fixture of the type described in connection with FIGS. 5 and 6 that is used for receiving device structures under test 98 in cavity 416) and an upper test fixture portion 500. As shown in FIG. 8, the lower test fixture portion may be attached to a mounting plate 520. Upper test fixture portion 500 may include antenna 86 coupled to upper plate 502 through support members 504. Cable clamping structures such as cable clamping structures 506 may be attached to upper plate 502. Clamping structures may each include a lever 508 that, when moved in direction 508, may be used to secure a radio-frequency cable inserted into hole 512. A radio-frequency cable inserted into hole 512 of clamping structure 506 may mate with a corresponding cable connector in upper plate 510. These cable connectors in upper plate 510 may be coupled to the positive and ground feeds of antenna 86 using conductive paths routed through support members 504. Radio-frequency cables inserted in this way may be used to convey radio-frequency test signals between test equipment 84 and antenna 86 during test operations.

The illustrative test setup of FIG. 8 may be used to test device structures under test 98 for manufacture variations without directly probing the surface of conductive members 16. For example, radio-frequency test signals may be coupled to device structures under test 98 using cable 82, probes 76, and capacitive coupling probes 414 (see, e.g., FIGS. 5 and 6). Device structures under test 98 may emit wireless radio-frequency signals when driven using the test signals from probe 76. Antenna 86 may be placed above device structures under test 98 (e.g., within 1 to 10 cm of device structures under test 98 or more than 10 cm or less than 10 cm away from device structures under test 98, as an example. During testing, as test electromagnetic signals are transmitted by network analyzer 212 and applied to device structures under test 98 through probes 76, corresponding transmitted wireless electromagnetic test signals may be received through antenna 86.

Figure 9:
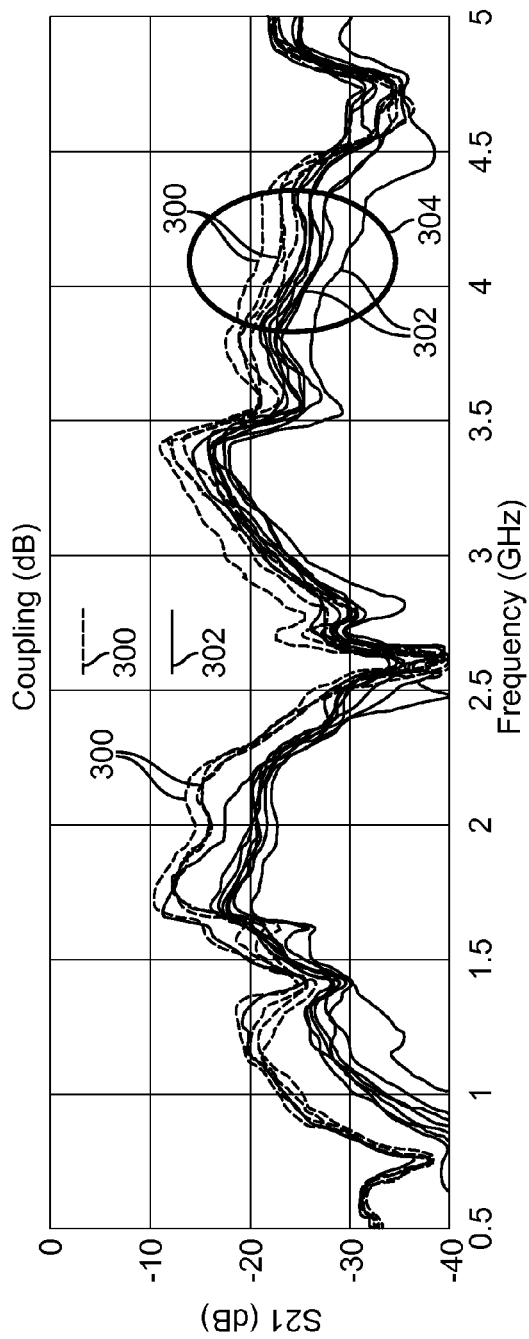
FIG. 9 is a graph in which forward transfer coefficient magnitude data that has been gathered using a test system of the type shown in FIG. 5 has been plotted as a function of applied signal frequency in accordance with an embodiment of the present invention.
Figure 10:
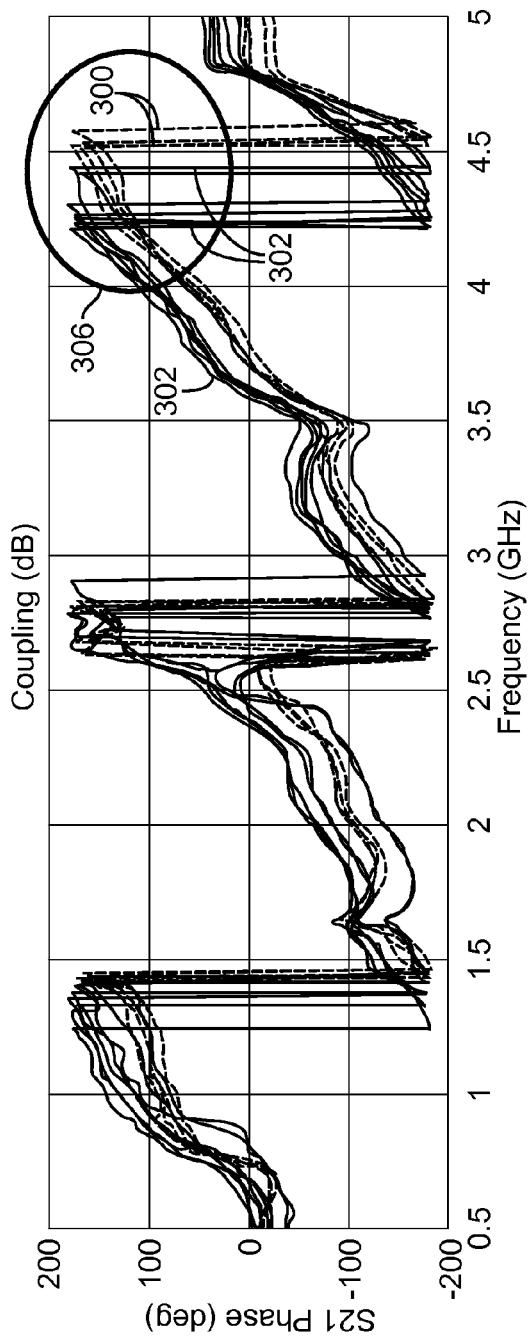
FIG. 10 is a graph in which forward transfer coefficient phase data that has been gathered using a test system of the type shown in FIG. 5 has been plotted as a function of applied signal frequency in accordance with an embodiment of the present invention.

Illustrative test data gathered using test system 94 is shown in FIGS. 9 and 10. In FIG. 9, the magnitude of forward transfer coefficient S21 has been plotted as a function of test signal frequency for a frequency range of 0 to 5 GHz. In FIG. 10, the phase of forward transfer coefficient S21 has been plotted as a function of test signal frequency for a frequency range of 0 to 5 GHz. There are two sets of curves in the graphs of FIGS. 9 and 10. Curves 300 correspond to reference data for device structures under test without conductive filaments and curves 302 correspond to data for device structures under test that include one or more conductive filaments. As indicated by illustrative frequency ranges 304 and 306 (e.g., about 3.5 to 5 GHz) in FIGS. 9 and 10, respectively, there are portions of these graphs in which the non-filament and filament versions of the test data exhibit significant variations. Other frequency ranges may be investigated if desired (e.g. a range of frequencies covering 1 to 5 GHz, a range of frequencies including frequencies between 2 and 4 GHz, etc.). Discrepancies between the expected (reference) and measured values of the S21 test data (or S11 test data or other test data measured using proves 76 and/or 86 in system 94) may be used to identify conductive electronic device structures that contains faults.

Figure 11:
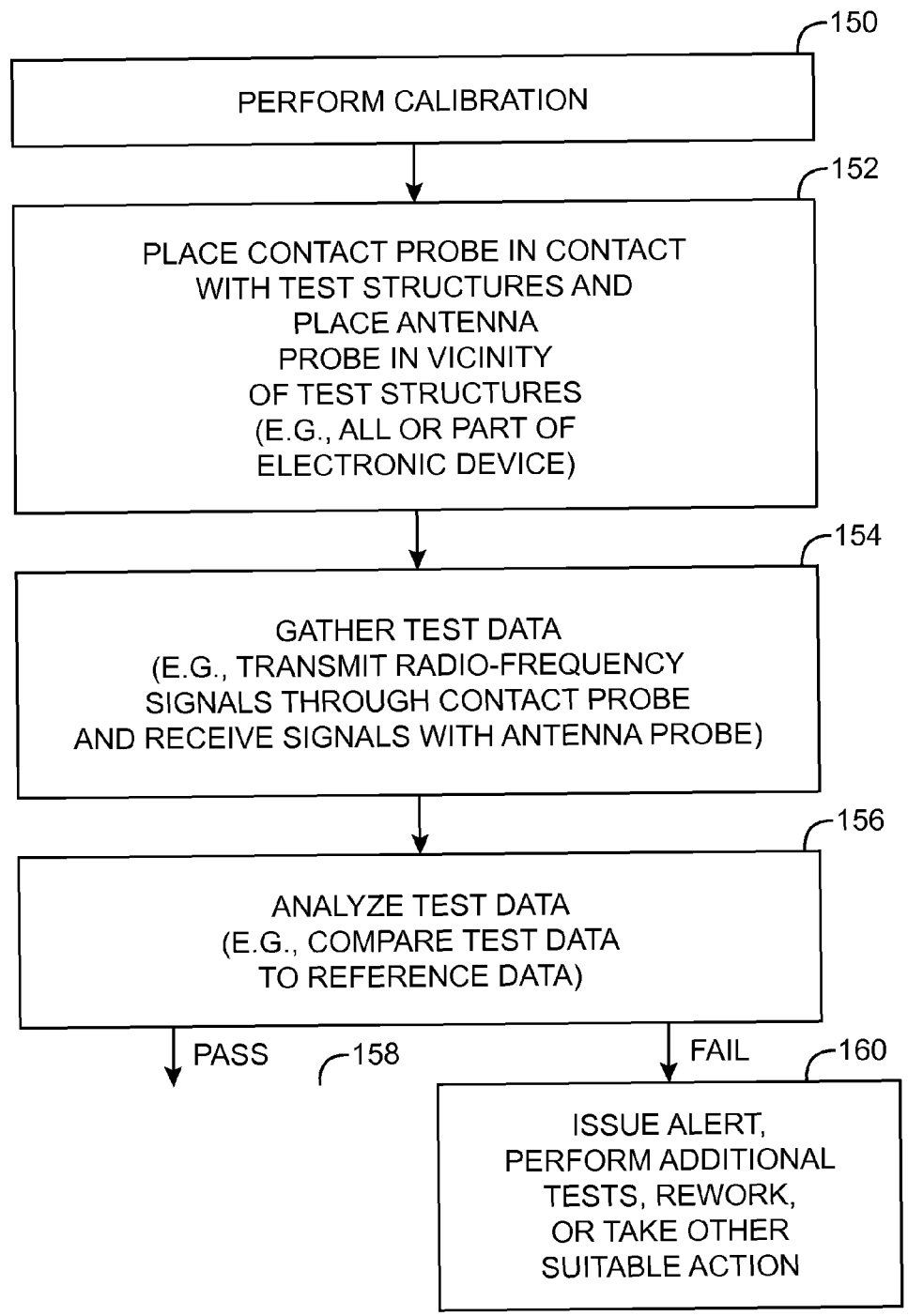
FIG. 11 is a flow chart of illustrative steps involved in using a test system of the type shown in FIG. 5 in testing electronic device structures in accordance with an embodiment of the present invention.

Illustrative steps involved in testing device structures under test 98 using a test system of the type shown in FIG. 5 are shown in FIG. 11.

At step 150, a test system operator may place one or more versions of electronic device structures under test 98 that have known satisfactory characteristics in test fixture 206 and may gather corresponding test results. For example, reflection coefficient measurements (magnitude and/or phase) and/or forward transfer coefficient measurements (magnitude and/or phase) may be obtained over a range of frequencies, as described in connection with FIGS. 9 and 10. The structures that are measured in this way may include substantially perfect (fault-free) structures and/or structures that exhibit acceptable manufacturing variations. For example, the structures that are measured may be members 16 that include gaps 18 that may or may not contain manufacturing faults such as burrs 70 (FIG. 3). The test measurement data that is gathered during the operations of step 150 may be stored in test equipment 84 (e.g., vector network analyzer 212 and/or computing equipment 214) to serve as baseline data (sometimes referred to as reference data or calibration data) to which subsequent test data may be compared when testing device structures of unknown quality during manufacturing.

After gathering baseline data on device structures with known characteristics (e.g., device structures that are known to be filament free) during the operations of step 150, device structures may be tested in a production environment. In particular, during the operations of step 152, a test system operator may repeatedly place device structures under test 98 into test fixture 206 so that contacts 78 come into contact with portions of member 16 or other conductive portions of device structures under test 98 and, during the operations of step 154, may gather test data on those structures. The test structures that are placed in test fixture 206 may include conductive structures such as bands 16 with gaps 18 that form part of one or more electronic device antennas or may be other conductive device structures. When gathering test data during the operations of step 154, test equipment 84 may transmit radio-frequency signals via probe 76. While transmitting radio-frequency signals via probe 76, test equipment 84 may receive reflected radio-frequency signals via cable 82 (for measuring reflection coefficient data) and may wirelessly receive radio-frequency signals using test antenna 86 (for measuring forward transfer coefficient data). The transmitted and received signals may be processed (e.g., to compute magnitude and phase S11 and S21 data to determine whether filaments or other manufacturing defects are present in structures 98).

At step 156, the test data that has been gathered from the device structures under test may be compared to the reference data that was collected during the calibration operations of step 150. In particular, the test data may be evaluated to determine whether or not the test data deviates by more than an acceptable amount from the baseline data gathered during the operations of step 150. In response to a determination that the test data is within acceptable limits, test equipment 84 may issue a corresponding alert to the test system operator (e.g., by displaying a "pass" message or other suitable information on a display in test equipment 84 or by issuing an audio alert) or may take other suitable actions (step 158). In response to a determination that the test data has varied from the reference data by more than acceptable limits, test equipment 84 may issue an alert that informs the system operator that the device structures under test have failed testing (e.g., a "fail message") or may take other suitable action (step 160). Structures that have passed testing may, for example, be assembled into finished products and sold to customers. Structures that have failed testing may be reworked or scrapped.

The foregoing is merely illustrative of the principles of this invention and various modifications can be made by those skilled in the art without departing from the scope and spirit of the invention.

What is claimed is:

1. A method for testing conductive electronic device housing structures using test equipment that includes an associated test probe with test probe contacts and that includes an associated antenna, comprising:
   placing the test probe contacts into contact with the conductive electronic device housing structures;
   while the test probe contacts are in contact with the conductive electronic device housing structures, conveying radio-frequency test signals through the test probe contacts to test the conductive electronic device housing structures; and
   with the antenna, wirelessly receiving corresponding wireless test signals while the radio-frequency test signals are being conveyed through the test probe contacts.

2. The method defined in claim 1 wherein the conductive electronic device housing structures comprise a peripheral conductive housing member having a gap and wherein conveying the radio-frequency test signals comprises transmitting radio-frequency test signals to the peripheral conductive housing member through the test probe contacts.

3. The method defined in claim 1 wherein the conductive electronic device housing structures comprise at least part of an electronic device antenna structure and wherein conveying the radio-frequency test signals comprises transmitting radio-frequency test signals through the part of the electronic antenna structure using the test probe contacts.

4. The method defined in claim 1 wherein conveying the radio-frequency test signals comprises:
   transmitting the radio-frequency test signals from the test equipment to the conductive electronic device housing structures through the test probe contacts; and
   receiving the radio-frequency test signals at the test equipment from the conductive electronic device housing structures through the antenna.

5. The method defined in claim 4 further comprising:
   with the test equipment, computing a forward transfer coefficient from the transmitted and received radio-frequency test signals.

6. The method defined in claim 5 wherein computing the forward transfer coefficient comprises computing a forward transfer coefficient over a frequency range that includes at least some frequencies in the range of 3.5 to 5 GHz.

7. The method defined in claim 2, wherein the test probe contacts comprise first and second contacts, wherein placing the test probe contacts into contact with the conductive electronic device housing structures comprises connecting the first and second contacts to respective portions of the peripheral conductive housing member on opposing sides of the gap.

8. The method defined in claim 5 further comprising:
   with the test equipment, comparing the forward transfer coefficient to reference forward transfer coefficient data to determine whether the conductive electronic device housing structures contain a fault.

9. The method defined in claim 1 further comprising:
   with network analyzer equipment in the test equipment that is coupled to the antenna, receiving the wireless test signals corresponding to the conveyed radio-frequency test signals from the antenna.

10. The method defined in claim 9, wherein conveying the radio-frequency test signals comprises using the network analyzer to transmit the radio-frequency test signals.

11. The method defined in claim 1, further comprising:
   with the test equipment, using at least the received wireless test signals to determine whether the conductive electronic device housing structures contain a fault.

* * * * *